United States Patent [19]

Lee

[11] Patent Number: 5,336,626
[45] Date of Patent: Aug. 9, 1994

[54] METHOD OF MANUFACTURING A MESFET WITH AN EPITAXIAL VOID

[75] Inventor: Yong H. Lee, Suwon, Rep. of Korea

[73] Assignee: Samsung Electronics Co., Ltd., Kyungki-do

[21] Appl. No.: 33,745

[22] Filed: Mar. 18, 1993

[30] Foreign Application Priority Data

Mar. 18, 1992 [KR] Rep. of Korea ............ 92-4436

[51] Int. Cl.$^5$ .......................... H01L 21/265
[52] U.S. Cl. ........................ 437/39; 437/912; 437/927
[58] Field of Search ............ 437/228, 41, 93, 40, 437/912, 927, 39, 175; 148/DIG. 73, DIG. 140; 257/283, 284

[56] References Cited

U.S. PATENT DOCUMENTS 4,178,197 12/1979 Marinace ........................ 148/175
5,274,257 12/1993 Kim et al. ...................... 257/284

OTHER PUBLICATIONS

Kim, Chang-Tae, Hong, C., Kwon, Y. "A GaAs MESFET with Very Short Channel Length . . . ", Business Center for Academic Societies Japan, Bunkyo-ku, Tokyo, Japan, 1991. Aug. 27-29, p. D-3-2.

Primary Examiner—George Fourson
Assistant Examiner—David Mason
Attorney, Agent, or Firm—Robert A. Westerlund; Stephen R. Whitt; Charles R. Donohoe

[57] ABSTRACT

The present invention relates to a MESFET in which source and drain regions with inverse slopes are formed on a semi-insulating semiconductor substarate having the insulating layer by using the growth property according to the crystal direction and a channel is electrically separated from the substrate by forming the channel layer and a self-aligned gate electrode sequentially on the top of the void formed by the inverse slopes of the source and drain regions. Thus, the present invention achieves the suppression of the leakage current and the backgating effect without the formation of a buffer layer, the formation of the gate electrode without misalignment, a short effective gate length and a low gate resistivity, thereby operating at high speed.

11 Claims, 2 Drawing Sheets

METHOD OF MANUFACTURING A MESFET WITH AN EPITAXIAL VOID

BACKGROUND OF THE INVENTION

The present invention relates to compound semiconductor field effect transistors (hereinafter termed "FETs") and more particularly, to an improved metal-semiconductor field effect transistor (hereinafter termed "MESFET") which can achieve high speed operation with forming a void by a selective epitaxy method and then forming structural elements such as electrodes by a self-alignment method and a fabricating method thereof.

Along with the advance of semiconductor fabricating technologies and circuit design techniques, GaAs process technologies have also been developed and so GaAs IC technologies have become comparable with Si IC technologies.

The development of information society necessitates high-performance semiconductor devices for ultrahigh-speed computer, ultrahigh-frequency and optical communications. Conventional Si devices have some technical limits in satisfying these requirements. Thus, investigations on compound semiconductors having superior material properties are being progressed actively.

Among the compound semiconductors, GaAs has three inherent advantages over Si. First, the electron mobility is large, thereby reducing series resistance of device structure. Second, the drift velocity is large at a given electric field, thereby improving the speed of devices. Third, GaAs can be made of an semi-insulating substrate. With these superior material properties, many kinds of devices are being developed, for example, MESFET, HBT(heterojunction bipolar transistor) and HEMT(high electron mobility transistor).

Among them, the weightiest technology is the MESFET where many majority carriers are transferred at the metal-semiconductor interface.

The MESFET is a fundamental device in the field of GaAs devices, wherein source and drain electrodes are formed in ohmic contact on a cap layer and between them a gate electrode is formed in schottky contact, and the current flow is controlled by a voltage applied to the gate electrode.

As a typical MESFET, there is a delta-doped MESFET (hereinafter, termed "δ-MESFET") which generates low noise and operates at high speed by two-dimensional electron gas generated by a Si monolayer.

FIG. 1 is a cross-sectional view of a conventional δ-MESFET. On a semi-insulating GaAs substrate 10, an undoped or p-type GaAs buffer layer 12, a delta-doped channel monolayer of Si 14, and an undoped GaAs spacer layer 16 are sequentially formed. At both sides of the spacer layer 16, n+ type source and drain regions 18 are formed invading the p-type buffer layer 12 slightly and on these source and drain regions 18, source and drain electrodes 15 and 17 are formed in ohmic contact. Also, a gate electrode 13 is formed in shottky contact with the surface of the spacer layer 16 where the source and drain regions 18 are not formed.

Now, a processing procedure for fabricating this δ-MESFET is described. A starting material is a semi-insulating GaAs substrate. First, an undoped or p-type GaAs layer, i.e., a buffer layer 12 is formed on the semi-insulating GaAs substrate 10. Subsequently, a thin undoped GaAs layer of about 100Å such as Si monolayer, i.e., a delta-doped layer 14 and an undoped GaAs spacer layer 16 are formed. These semiconductor layers are grown by the metal organic chemical vapor deposition (MOCVD) method. After forming a gate electrode 13 on the spacer layer 16, the n+ type source and drain regions 18 are formed at both sides of the spacer layer 16 by implanting n type impurities such as Si and then annealing. After that, source and drain electrodes 15 and 17 are formed on the n+ type source and drain regions 18 by the conventional lift-off method. In the conventional δ-MESFET fabricated as described just above, if a voltage is applied to the gate electrode 13 while a bias voltage is applied between the source and drain electrodes 15 and 17, the thickness of depletion region in the channel layer 14 is changed according to the strength of the applied voltage, controlling the quantity of current flowing through the channel, i.e., the quantity of current between the source and drain.

In the fabricating of the conventional δ-MESFET, however, the formation of the gate electrode 13 is made by the conventional photolithography process. Thus, it is very difficult to obtain a correct alignment without misalignment and also the gate resistance is large. Also, the buffer layer 12 is formed to cause the potential barrier against electron, thereby suppressing the leakage current due to the transmission of electrons with high energy to the substrate 10. Thus, the impurity concentration of the buffer layer 12 should be low as much as $10^{14}$ ions/cm$^3$ to increase the resistivity. However, since many layers are formed in a single chamber on the process of the δ-MESFET, the impurity concentration of the buffer layer 12 is increased due to other impurities which are to be doped into other layers and thus the resistance of the buffer layer 12 is lowered. Thus, it is difficult to grow a high-quality buffer layer having low impurity concentration and a thickness of a few thousands of Å. In addition to this, the buffer layer has an object to suppress the backgating effect that the width of current path is reduced due to the unnecessary depletion region between the channel and the substrate caused by the voltage difference between the semiconductor substrate and the neighboring electrode in an integrated circuit, thereby incresing the threshold voltage and the source resistance Rs. However, there still remains the backgating effect because of the leakage current of the buffer layer 12 due to the increase of the electric field in the channel layer of the voltage of the neighboring transistor.

SUMMARY OF THE INVENTION

An object of the present invention is to provide a MESFET which can prevent from being generated the leakage current by separating a channel region from a substrate region and breaking from the dependency on the formation of a buffer layer requiring high resistivity.

Another object of the present invention is to provide a MESFET which can prevent the backgating effect.

A further object of the present invention is to provide a MESFET which can reduce the effective gate length and gate resistivity.

According to the present invention, there is provided a MESFET comprising: a semi-insulating compound semiconductor substrate, an insulating layer formed with a specific tilting angle from $<\bar{1}00>$ direction of the substrate, a first semiconductor layer provided with a void having a specific distance between the pointed ends, which the top thereof is opened on the substrate, and formed separately by this void, a second semiconductor layer formed on the void and the first semiconductor layer, a gate electrode formed on the second semiconductor layer, and source and drain electrodes formed on the first semiconductor layer at both sides of the gate electrode.

According to the present invention, there is also provided a method for fabricating a MESFET, the method comprising: a first process for forming an insulating layer on a semi-insulating compound semiconductor substrate in a specific tilting angle from $<\overline{1}00>$ direction of the substrate, a second process form forming a first semiconductor layer by selective epitaxy on the substrate using the insulating layer as a mask that is separated by a void formed on the insulating layer, a third process for forming nitride and oxide layers with a first open hole part on the first semiconductor layer, a fourth process for forming a second open hole part that is larger than the first open hole part by etching the nitride layer under the oxide layer through the first open hole part, a fifth process for forming a second semiconductor layer which is completely filled inside the second open hole part and on the surface of the inverse slopes by epitaxy on the entire surface of the inverse slopes of the first semiconductor layer, a sixth process for forming a gate electrode by depositing a metal on the second semiconductor layer and the oxide layer which are exposed through the first open hole part and patterning the metal layer, and a seventh process for forming source and drain electrodes on the first semiconductor layer at both sides of the gate electrode by removing the nitride and oxide layers and depositing a metal on the structure.

In the present invention as described above, the leakage current and the backgating effect as can be shown in the conventional buffer layer are prevented since the channel layer is separated from the semiconductor substrate by the void formed under the channel layer. Also, the gate electrode is formed by self-alignment so that it can be laid on the channel layer without misalignment and the effective gate length that plays an important role in determining device performances can be reduced. Furthermore, the gate electrode can be formed in T-shape on fabricating process so that it is widened without the increase of input parasitic capacitance. An ohmic metal with high conductivity is deposited on the gate electrode, reducing the total resistance of the gate.

DETAILED DESCRIPTION OF THE INVENTION

FIGS. 2A to 2F are cross-sectional views in each step of fabricating a MESFET with void structure according to an embodiment of the present invention.

Figure 1:
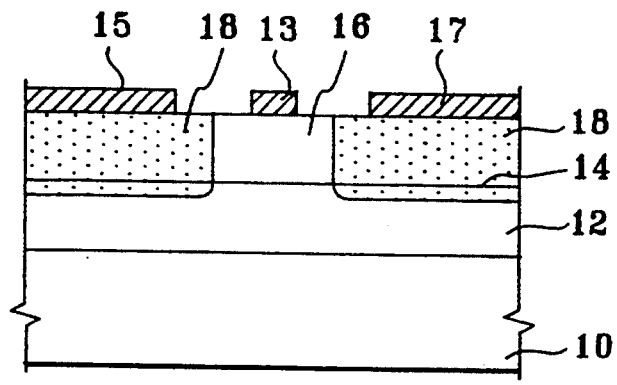
FIG. 1 illustrates a cross-sectional view of a conventional MESFET.
Figure 2A:
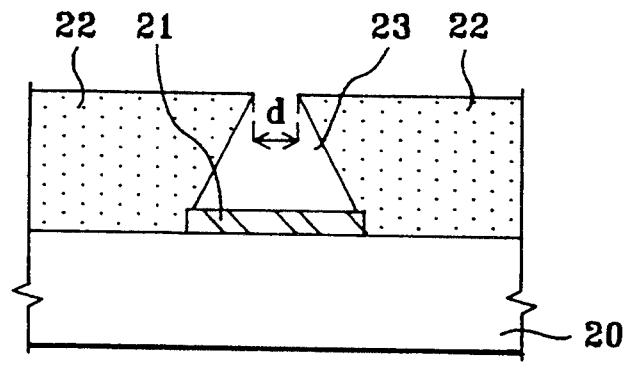
FIGS. 2A to 2F illustrate processing steps for fabricating a MESFET according to an embodiment of the present invention.
Figure 2B:
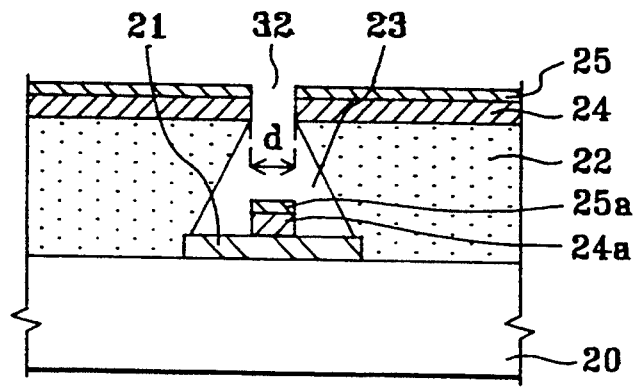
Figure 2C:
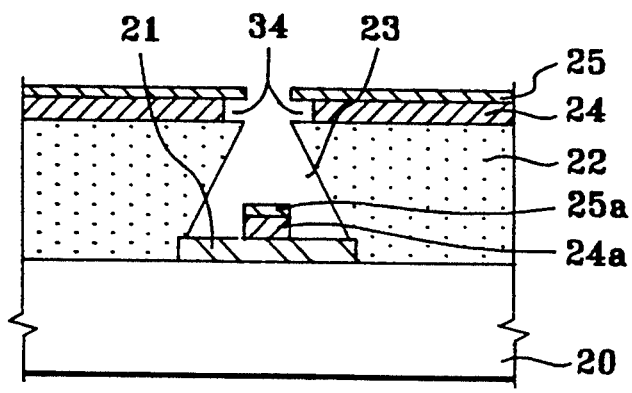
Figure 2D:
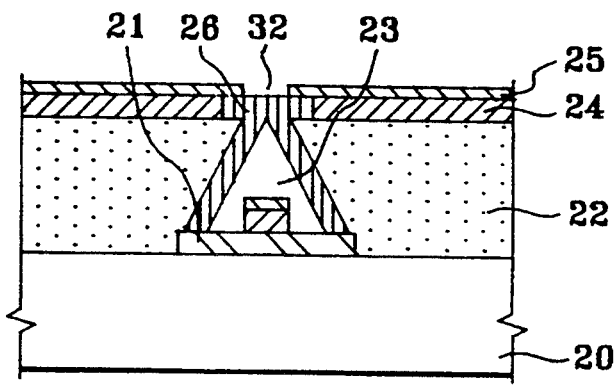
Figure 2E:
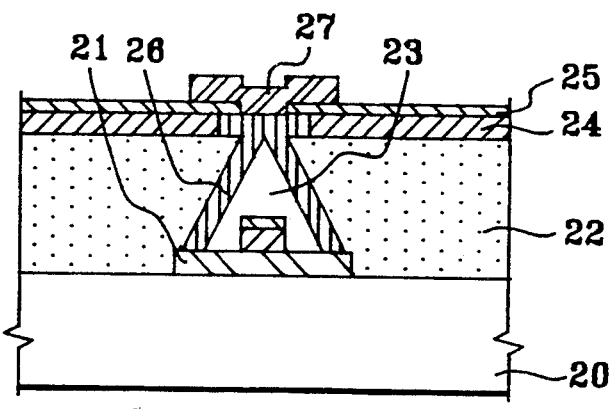
Figure 2F:
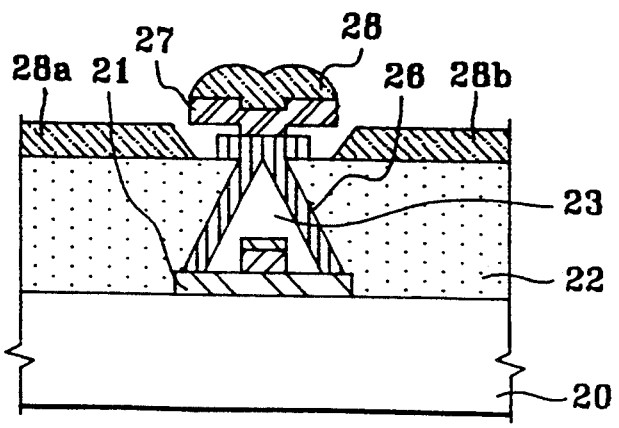

Before describing the fabricating method, the final structure of this embodiment shown in FIG. 2F is observed. An insulating layer 21 is formed on a semi-insulating GaAs substrate 20 with a crystal orientation of (001), tilted as much as 20°~30° from $<\overline{1}00>$ direction. This insulating layer 21 is formed of either of $SiO_2$ and $Si_3N_4$, and has a thickness of 0.05~0.1 μm and a width of 1.0~2.0 μm. N+ type GaAs layers 22 having a thickness of 0.3~0.8 μm are formed on the GaAs substrate 20. A triangle-shaped void 23 is formed on the insulating layer 21. The top of the void 23 is opened with a distance between pointed ends of 0.5~1.5 μm. Also these n+ type GaAs layers 22 become source and drain regions of the MESFET. The void 23 is formed in the inside of the n+ type GaAs layers 22 so that the n+ type GaAs layers 22, i.e., source and drain regions are separated from each other. An n type channel layer 26 is formed on the n+ type GaAs layers 22 having the void structure therein. This channel layer 26 is formed over the entire slopes of the void 23. A T-shaped gate electrode 27 is formed in shottky contact on the channel layer 26 and an ohmic metal 28 with high conductivity is laid on this gate electrode 27. Also, source and drain electrodes 28a and 28b are formed in ohmic contact on the n+ type GaAs layers 22 at both sides of the gate electrode 27.

In the MESFET having the structure described above, the void 23 completely separates the channel layer 26 and the semiconductor substrate 20 electrically from each other. Thus, this void 23 excludes the possibility of generation of voltage difference between the semiconductor substrate 20 and the neighboring electrode not shown. That is to say, forming an unnecessary depletion region between the channel 26 and the substrate 20 is prevented, thereby eliminating the backgating effect.

The MESFET according to this embodiment can be understood more obviously by a fabricating sequence of FIGS. 2A to 2F described hereinafter.

Referring to FIG. 2A, first, the insulating layer 21 of $SiO_2$ or $Si_3N_4$ is deposited with a thickness of 0.05~0.1 μm on the semi-insulating GaAs substrate 20 having a crystal orientation of (100). After that the insulating layer 21 having a width of 1.0~2.0 μm is formed by the photolithography process, tilted as much as 20°~30° from $<\overline{1}10>$ direction of the GaAs substrate 20. The width of the insulating layer 21 determines the height of the void formed in the next process. Subsequently, the n+ type GaAs layers 22, i.e., the source and drain regions are formed by the selective MOCVD method on the top of the GaAs substrate 20 where the insulating layer 21 is not formed, having a tilting angle of 20°~30° from $<\overline{1}10>$ direction. At that time, the triangular-shaped void is formed in the inside of the n+ type GaAs layers 22 so that two separated GaAs layers are formed. That is to say, since the insulating layer 21 is used as a mask in the selective MOCVD process, the n+ type GaAs layers 22 are formed not on the insulating layer 21 but on the GaAs substrate 20. A distance "d" between the pointed ends at the top of the void is about 0.5~1.5 μm. The thickness of the n+ type GaAs layers 22 is about 0.3~0.8 μm.

Referring to FIG. 2B, a nitride layer 24 and an oxide layer 25 are formed on the structure by the conventional sputtering method. Since the layer is vertically grown on the plane of the structure by the sputtering method, the nitride layer 24a and the oxide layer 25a are left inside the void 23 and an oxide open hole part 32 having a size corresponding to a distance "d" between the pointed ends of the void 23 is formed on the n+ type GaAs layers 22. The thickness of the nitride layer 24 determines the thickness of the channel layer 26 described later and has to be chosen properly, considering the characteristics of the device. A thickness of the nitride layer 24 is preferable to be about 0.1~0.3 μm.

Referring to FIG. 2C, if an isotropic etching is carried out by a dry etching method, a nitride open hole part 34 under the oxide layer 25 is etched wider than the oxide open hole part 32. This is possible because the nitride layer 24 has a sufficiently large etching selectivity ratio over the oxide layer 25. In other words, the nitride layer 24 is etched 3~5 times faster than the oxide layer 25. The width of the etched nitride open hole part 34 determines the length of the channel layer and is about 0.1~0.3 μm in both directions. The etched oxide open hole part 32 determines the length of the gate. The channel and gate are to be described later.

Referring to FIG. 2D, an n type GaAs layer, i.e., the channel layer 26 is formed by the selective MOCVD method. The channel layer 26 is formed over the entire surface of the inverse slopes of the void formed by the n+ type GaAs layers 22. The selective growth is continued until the distance "d" between the pointed ends of the void 23 is filled according to the progress of crystal growth and the nitride open hole part 34 is fully filled. To see the resultant structure after forming the channel layer 26, the channel layer 26 is filled into the nitride open hole part 34 and is exposed through the oxide open hole part 32.

Referring to FIG. 2E, the T-shaped gate electrode 27 is formed by depositing Ti/Pt/Au, Al or Pt on the oxide layer 25 and the channel layer 26 and patterning it. Here, the gate electrode 27 is formed in shottky contact on the channel layer 26 by self-alignment through the oxide open hole part 32. Thus, the gate electrode 27 can be laid on the oxide open hole part 32. Thus, the gate electrode 27 can be laid on the channel layer 26 without misalignment. As mentioned earlier, since the length of the gate electrode 27 is determined by the width of the oxide open hole part 32, it is easy to form a short effective gate length which is very important in determining the characteristics of the device. Also, the gate electrode 27 is formed in a T shape by self-alignment on the process. The T-shaped gate structure does not cause the parasitic capacitance and also forms the gate wider.

Referring to FIG. 2F, by removing the nitride layer 24 and the oxide layer 25 and then depositing AuGe/Ni/Au on the structure, the source and drain electrodes 28a and 28b are formed on the n+ type GaAs layers 22 at both sides of the gate electrode 27 as well as on the top of the gate electrode 27. Also, the present invention is described only for an example of GaAs with (100) orientation but the substrate can have (001) or (010) orientation and it also can be other compound semiconductors such as InP and GaP.

The present invention described heretofore forms the source and drain regions on the semi-insulating semiconductor substrate having the insulating layer by using the crystal growth according to the crystal direction and electrically separates the channel from the substrate by forming the channel layer and the self-aligned gate electrode sequentially on the top of the void formed by the source and drain regions. Thus, the present invention achieves a high-speed MESFET by suppressing the leakage current and the backgating effect without forming a buffer layer, forming the gate electrode without misalignment, and reducing the effective gate length and the gate resistivity.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What is claimed is:

1. A method for fabricating a MESFET, comprising:
exposing a surface of a semi-insulating compound semiconductor substrate oriented at an angle to the $<\bar{1}10>$ crystalline plane of said substrate and forming an insulating layer on said exposed surface;
forming a fist semiconductor layer on said substrate, using said insulating layer as a mask, so as to form a void above said insulating layer and a first hole in said first semiconductor layer;
forming a nitride layer on said first semiconductor layer and through said first hole on an exposed surface of said insulating layer;
forming an oxide layer on said nitride layer;
forming a second hole in said nitride layer by selectively etching said nitride layer under said oxide layer through said first hole, said second hole having a larger diameter than that of said first hole;
forming a second semiconductor layer on surfaces defining said second hole, such as to completely fill said second hole, and on inversely sloped surfaces defining said void;
depositing a first metal layer on an exposed surface of said second semiconductor layer and on said oxide layer, and patterning said first metal layer so as to form a gate electrode;
removing said oxide and nitride layers; and,
depositing a second metal layer on said first semiconductor layer on opposite sides of said gate electrode, to thereby form source and drain electrodes.

2. The method as set forth in claim 1, wherein said exposed surface of said substrate is oriented at an angle of 20°–30° from the $<\bar{1}10>$ crystalline plane of said substrate.

3. The method as set forth in claim 1, wherein said forming a first semiconductor layer on said substrate step is carried out by means of a selective MOCVD.

4. The method of as set forth in claim 3, wherein said insulating layer is made of material selected from a group consisting of $SiO_2$ and $Si_3N_4$.

5. The method as set forth in claim 1, wherein said forming a first semiconductor layer on said substrate step is carried out in such a manner that the pointed ends of said first semiconductor layer defining said first hole are formed so as to have a distance between them which defines the diameter of said first hole.

6. The method as set forth in claim 5, wherein said distance is between 0.5 μm–1.0 μm.

7. The method as set forth in claim 1, wherein said forming a nitride layer and said forming an oxide layer steps are each carried out by means of a sputtering process.

8. The method as set forth in claim 1, wherein the thickness of said nitride layer is between 0.1 μm–0.3 μm.

9. The method as set forth in claim 1, wherein said step of forming a second hole is carried out by means an isotropic dry etching process, the etching selectivity ratio between said nitride layer and said oxide layer being sufficiently large to ensure that said nitride layer is undercut beneath said oxide layer.

10. The method as set forth in claim 7, wherein the thickness of said nitride layer is between 0.1 μm–0.3 μm.

11. The method as set forth in claim 1, wherein said step of forming a second semiconductor layer is carried out by means of an epitaxial deposition process.

* * * * *